United States Patent
Peterson et al.

(10) Patent No.: US 10,291,976 B2
(45) Date of Patent: May 14, 2019

(54) ELECTRONIC DEVICES WITH CONFIGURABLE CAPACITIVE PROXIMITY SENSORS

(71) Applicant: Apple Inc., Cupertino, CA (US)

(72) Inventors: Jonathan R. Peterson, Woodinville, WA (US); Mark A. Bunney, Jr., Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/808,733

(22) Filed: Nov. 9, 2017

(65) Prior Publication Data

US 2018/0288515 A1 Oct. 4, 2018

Related U.S. Application Data

(60) Provisional application No. 62/480,218, filed on Mar. 31, 2017.

(51) Int. Cl.
| | |
|---|---|
| H04R 5/02 | (2006.01) |
| H04R 1/10 | (2006.01) |
| G01D 5/241 | (2006.01) |
| G06F 1/3231 | (2019.01) |
| H03K 17/955 | (2006.01) |
| G01P 15/08 | (2006.01) |
| H04R 5/033 | (2006.01) |

(52) U.S. Cl.
CPC ........... *H04R 1/1041* (2013.01); *G01D 5/241* (2013.01); *G06F 1/3231* (2013.01); *H03K 17/955* (2013.01); *H04R 1/1008* (2013.01); *G01P 15/08* (2013.01); *G01P 15/0802* (2013.01); *H04R 5/033* (2013.01)

(58) Field of Classification Search
CPC .................................................... H04R 5/02
See application file for complete search history.

(56) References Cited

U.S. PATENT DOCUMENTS

| | | | |
|---|---|---|---|
| 9,007,333 B1 | 4/2015 | Wilson et al. | |
| 9,330,243 B2 | 5/2016 | Klinghult | |
| 9,357,045 B2* | 5/2016 | Oishi | H04M 1/23 |
| 9,838,812 B1* | 12/2017 | Shetye | H04R 29/001 |
| 2009/0139778 A1* | 6/2009 | Butler | G06F 1/1626 |
| | | | 178/18.03 |
| 2009/0214060 A1* | 8/2009 | Chuang | A61B 5/0478 |
| | | | 381/151 |
| 2013/0121494 A1* | 5/2013 | Johnston | H04R 1/1041 |
| | | | 381/56 |

(Continued)

*Primary Examiner* — Olisa Anwah
(74) *Attorney, Agent, or Firm* — Treyz Law Group, P.C.; G. Victor Treyz; Joseph F. Guihan

(57) ABSTRACT

An electronic device such as a pair of headphones may be provided with ear cups having speakers for playing audio to a user. Capacitive proximity sensor electrodes having acoustic openings may overlap the speakers. The capacitive proximity sensor electrodes may include electrodes that are arranged in a ring. Control circuitry in the electronic device may use the capacitive proximity sensor electrodes to measure ear patterns of a user when the headphones are being worn on the head of the user. The control circuitry may include switching circuitry that allows the electrodes to be dynamically combined to form electrodes of enlarged area to enhance detection range or to form separate electrodes to enhance spatial resolution.

21 Claims, 9 Drawing Sheets

(56) References Cited

U.S. PATENT DOCUMENTS

| | | | |
|---|---|---|---|
| 2013/0182867 A1* | 7/2013 | Knowles | H04B 7/0834 381/74 |
| 2013/0238340 A1* | 9/2013 | Walsh | G10L 13/04 704/260 |
| 2014/0146976 A1* | 5/2014 | Rundle | H04R 1/1083 381/71.6 |
| 2015/0003634 A1 | 1/2015 | Yliaho et al. | |
| 2016/0366507 A1* | 12/2016 | Hou | H04R 1/1041 |
| 2017/0094411 A1* | 3/2017 | Peterson | H04R 5/033 |
| 2017/0180898 A1* | 6/2017 | Puskarich | H04R 29/001 |
| 2017/0280223 A1* | 9/2017 | Cavarra | H04R 1/1041 |
| 2017/0339484 A1* | 11/2017 | Kim | H04R 1/1041 |
| 2017/0374448 A1* | 12/2017 | Patel | H04R 1/1041 |
| 2018/0039086 A1* | 2/2018 | Jiang | G02B 27/0101 |
| 2018/0063621 A1* | 3/2018 | Qian | H04R 1/406 |
| 2018/0116514 A1* | 5/2018 | Turner | A61B 5/0006 |
| 2018/0124532 A1* | 5/2018 | Shetye | H04R 29/001 |

\* cited by examiner

US 10,291,976 B2

ELECTRONIC DEVICES WITH CONFIGURABLE CAPACITIVE PROXIMITY SENSORS

This application claims the benefit of provisional patent application No. 62/480,218, filed Mar. 31, 2017, which is hereby incorporated by reference herein in its entirety.

BACKGROUND

This relates generally to electronic devices, and, more particularly, to electronic devices such as headphones.

Electronic devices such as headphones may contain audio circuitry and speakers for playing audio content for a user. To ensure satisfactory playback of content through the left and right speakers of a set of headphones, the left and right speakers of many headphones are labeled "left" and "right." If a user accidentally wears the headphones in the incorrect orientation with the left speaker on right ear and right speaker on left ear, stereo audio playback will be reversed from its expected configuration. This can lead to undesirable user experiences such as when a user is listening to a movie soundtrack and action on the right of the screen results in sounds in the user's left ear.

It would therefore be desirable to be able to provide improved electronic devices such as improved headphones.

SUMMARY

An electronic device such as a pair of headphones may be provided with ear cups having speakers for playing audio to a user. An array of sensor structures such as capacitive proximity sensor electrodes may overlap the speakers. The capacitive proximity sensor electrodes may include electrodes that are arranged in a ring. Acoustic openings may be formed in the electrodes to accommodate sound from the speakers. In some configurations, the electrodes may include sense electrodes on a first side of substrate and corresponding reference electrodes on a second side of the substrate. The substrate may have acoustic openings that overlap the acoustic openings in the electrodes. One or more layers such as fabric layers and/or mesh layers may overlap the electrodes.

Control circuitry in the electronic device may use the capacitive proximity sensor electrodes to measure user ear patterns when the headphones are being worn on the head of a user. By detecting left ear patterns and right ear patterns in the sensor measurements, the control circuitry can recognize whether the headphones are being worn in a normal or reversed orientation and can adjust the left and right channel assignments for the audio being played back by the speakers accordingly The control circuitry may include switching circuitry that allows the electrodes to be dynamically combined to form electrodes of enlarged area to enhance detection range. In some operating modes, progressively fewer electrodes may be combined to enhance spatial resolution.

This technique of selectively enhancing capacitive array sensitivity may be used in any suitable device with a capacitive sensor array (e.g., a pillow with capacitive sensors that has an ear sensor to determine which side a person is sleeping on, etc.). Moreover, other types of sensor (e.g., optical proximity sensors, inductive proximity sensors, etc.) may also have arrays of sensor elements that are dynamically combined to trade off sensitivity (detection range) increases for spatial resolution and vice versa. The use of arrays of capacitive proximity sensor electrodes is merely illustrative.

DETAILED DESCRIPTION

An electronic device may be provided with sensors that monitor how the device is oriented relative to the body of a user. The sensors may, for example, include capacitive proximity sensors and other sensors that monitor how a user is wearing a pair of headphones on the user's head (e.g., which ear cup of the headphones is on the user's left ear and which ear cup of the headphones is on the user's right ear). Based on knowledge of the orientation of the headphones on the user's head or other orientation information, the headphones or other electronic device can be configured appropriately. For example, left and right stereo headphone channel assignments may be placed in a normal or reversed configuration, and other device settings may be changed. The electronic device may be any electronic equipment that includes a capacitive sensor array. For example, the electronic device may be formed from fabric (e.g., the device may be a pillow such as a pillow that uses an array of capacitive proximity sensors that are configured to measure a user's ears to determine which side a user is sleeping on), may be a wearable device (e.g., the device may be a piece of clothing that includes sensors and processing circuitry), may be incorporated into an embedded system (e.g., in furniture, an automobile, or other environment), may be incorporated into a cellular telephone with an array of capacitive sensors on a display or housing structure, or may be other suitable electronic equipment with an array of dynamically configurable sensors.

Figure 1:
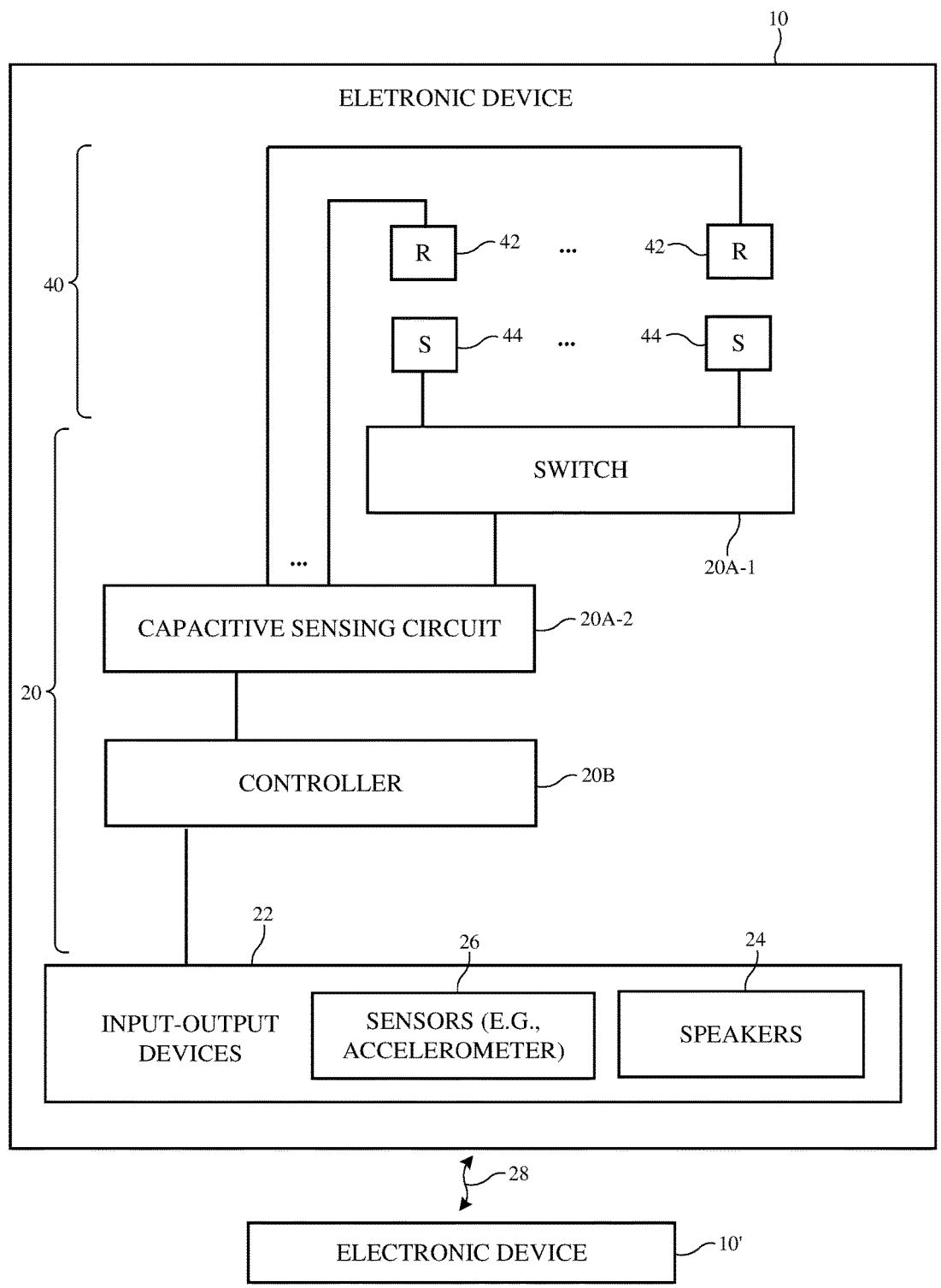
FIG. 1 is a schematic diagram of an illustrative electronic device in accordance with an embodiment.

FIG. 1 is a schematic diagram of an illustrative electronic device. As shown in FIG. 1, electronic device 10 may communicate wirelessly with external equipment such as electronic device 10' using wireless link 28. Wireless signals for link 28 may be light-based signals, may be acoustic signals, and/or may be radio-frequency signals (e.g., wireless local area network signals, Bluetooth® signals, radio-frequency signals in cellular telephone band, signals at 60 GHz, near field communications signals, etc.). Equipment 10 and equipment 10' may have antennas and wireless transceiver circuitry for supporting wireless communications over link 28 (e.g., input-output circuitry in device 10 such as devices 22 may include antennas, wireless transceiver circuitry, and/or other communications circuitry for supporting wireless communications over link 28). Equipment 10' may have the same capabilities as equipment 10 (i.e., devices 10 and 10' may be peer devices) or equipment 10' may include fewer resources or more resources than device 10.

Illustrative device 10 of FIG. 1 has control circuitry 20. Control circuitry 20 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 20 may be used to control the operation of device 10 (see, e.g., controller 20B). The processing circuitry may be based on one or more microprocessors, microcontrollers, digital signal processors, baseband processors, power management units, audio chips (e.g., chips with audio amplifiers that can be selectively assigned to play right channel audio in a first ear speaker of device 10 and left channel audio in a second ear speaker or vice versa), application specific integrated circuits, etc.

Device 10 may include a sensor that has sensor elements that can be dynamically reconfigured to enhance detection range or to enhance spatial resolution (see, e.g., sensors 26 of FIG. 1). The dynamically reconfigurable elements may be, for example, optical proximity sensor elements (e.g., light sources such as infrared light-emitting diodes and corresponding infrared light detectors), inductive proximity sensor elements (e.g., induction loops and corresponding current sensing circuits for detecting changes in current due to the changing presence of metals or other materials in the vicinity of the loops), or other proximity sensor circuits that can be configured to join some or all of the elements together to enhance detection sensitivity or configured to separate these elements to enhance spatial resolution. Controller 20B may control switching circuitry (e.g., switching circuitry 20A-1 or other suitable switching circuitry in device 10 coupled to sensor elements 26) to dynamically combine sets of two or more proximity sensor elements to strengthen the signals from those sensors and thereby enhance range or may configure the switching circuitry so that controller 20B receives individual sensor element measurements, thereby enhancing sensor measurement spatial resolution. Configurations in which elements 40 are capacitive proximity sensor electrodes may sometimes be described herein as an example. This is, however, merely illustrative. Device 10 may be any suitable type of equipment and may include any suitable array of dynamically reconfigurable sensor elements (e.g., any suitable array of dynamically reconfigurable proximity sensor elements).

As shown in the illustrative configuration of FIG. 1, device 10 may include a capacitive proximity sensor having electrodes 40. Control circuitry 20 may include circuitry for dynamically configuring electrodes 40 and using electrodes 40 in making capacitive proximity sensor measurements. For example, control circuitry may include capacitive proximity sensor circuitry that is coupled to electrodes 40 such as capacitive sensing circuitry 20A-2 and switching circuitry such as switch 20A-1. Capacitive proximity sensor electrodes 40 may include reference electrodes 42 and sense electrodes 44 and/or other electrode structures. Switch 20A-1 may be dynamically configured based on control signals from controller 20B so that capacitive proximity sensor measurements can be gathered with a desired configuration of electrodes 40. In one mode of operation, each of reference electrodes 42 and each corresponding sense electrode 44 may be used in making a separate capacitive proximity sensor measurement. This maximizes detection spatial resolution. In other modes of operations, switch 20A-1 may be configured to couple together sets of electrodes to enhance detection range. In these operating modes, sets of two or more sense electrodes are shorted together while gathering sensor data. The electrodes that are shorted together in this way serve as unitary electrodes of increased size, which enhances proximity detection sensitivity.

Input-output circuitry in device 10 such as input-output devices 22 may be used to allow data to be supplied to device 10 and to allow data to be provided from device 10 to external devices. Input-output devices 22 may include buttons, joysticks, scrolling wheels, touch pads, key pads, keyboards, tone generators, vibrators, cameras, sensors 26 (e.g., ambient light sensors, magnetic sensors, force sensors, touch sensors, accelerometers, and other sensors), light-emitting diodes and other status indicators, data ports, displays, etc. Input-output devices 22 may include audio components such as microphones and speakers 24. Speakers 24 may be mounted in left and right ear cups in over-the-ear or on-the-ear headphones. The headphones may have a supporting member that couples the ear cups together and/or may be coupled using supporting members in a head mounted display (e.g., a helmet, goggles, or glasses with ear cups, and/or may have other headphone configurations.

A user can control the operation of device 10 by supplying commands through input-output devices 22 and may receive status information and other output from device 10 using the output resources of input-output devices 22.

Control circuitry 20 may be used to run software on device 10 such as operating system code and applications. During operation of device 10, the software running on control circuitry 20 may use the capacitive proximity sensor formed from electrodes 40 (e.g., a capacitive proximity sensor(s) in one or both ear cups) to gather information on how device 10 is oriented (e.g., which ear cup is located on the user's right ear and which ear cup is located on the user's left ear) and other information about the usage of device 10. This software may also gather and use other information such as accelerometer signals from sensors 26 (e.g., signals indicating that device 10 is in use by a user or is not in use) and may gather and use other information from input-output devices 22 in device 10 (e.g., button input, voice input, and/or other input from a user). A user may, for example, supply to buttons, touch sensors, or other devices 22 using one or more fingers and/or other external objects (e.g., a stylus, etc.).

The left ear cup, right ear cup, or both the left and right ear cups may be provided with electrodes 40. The capacitive proximity sensor formed from each array of electrodes 40 may be dynamically configured to help device 10 determine the orientation of device 10 with respect to the user's head or other body part. For example, capacitive electrodes 40 may be dynamically combined to extend proximity sensing range and may be dynamically separated to increase capacitive proximity sensor resolution, thereby helping device 10 to identify which ear cup of a pair of headphones is covering the right ear of the user and which ear cup is covering the left ear. With this information, device 10 can determine whether the headphones are being worn in an unreversed or in a reversed configuration and can make audio adjustments accordingly (e.g., by adjusting left/right channel assignments using control circuitry 20 such as controller 20B).

Figure 2:
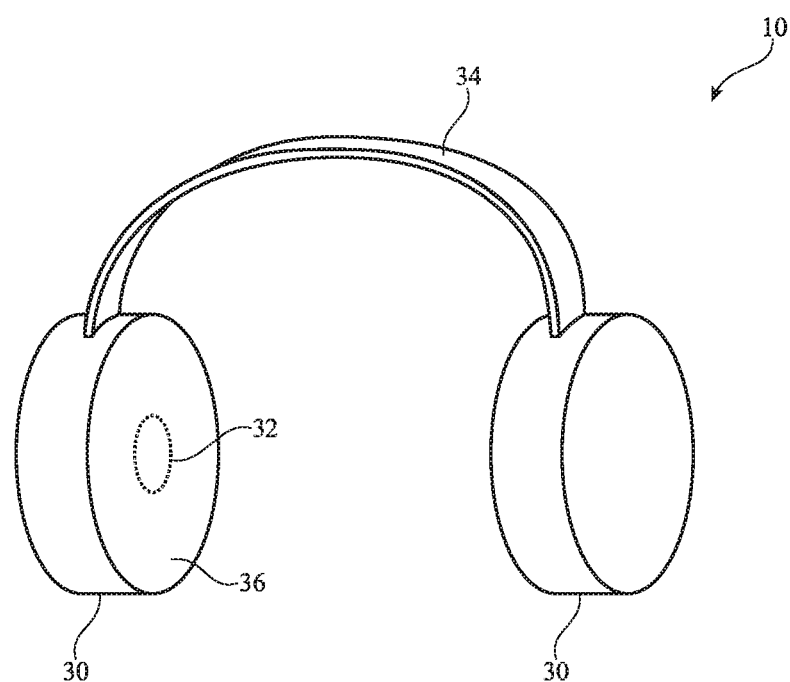
FIG. 2 is a perspective view of an illustrative electronic device such as a pair of headphones in accordance with an embodiment.

Electronic device 10 (and external equipment 10') may, in general, be any suitable electronic equipment. Electronic device 10 (and device 10') may, for example, be a computing device such as a laptop computer, a computer monitor containing an embedded computer, a tablet computer, a cellular telephone, a media player, or other handheld or portable electronic device, a smaller device such as a wristwatch device (e.g., a watch with a wrist strap), a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, furniture, fabric-based items such as pillows and clothing, equipment that implements the functionality of two or more of these devices, or other electronic equipment. FIG. 2 is a perspective view of an illustrative electronic device. In the illustrative configuration of FIG. 2, device 10 is a portable device such as a pair of headphones (earphones). Other configurations may be used for device 10 if desired. The example of FIG. 2 is merely illustrative.

As shown in FIG. 2, device 10 may have ear cups such as ear cups 30. There may be two ear cups 30 in device 10 that are coupled by a supporting member such as band 34 or other support structure. Band 34 may be flexible and may have a curved shape to accommodate a user's head. There may be left and right ear cups 30 in device 10, one for one of the user's ears and the other for the other of the user's ears. Each ear cup may have an area such as area 32 through which sound may be emitted from a speaker (e.g., a speaker system with one or more drivers). User-facing ear cup surfaces 36 on the ear cups may be provided with electrodes 40 so that capacitive proximity sensor measurements may be made of the user's ear to determine device orientation. Control circuitry 20 may be coupled to electrodes 40 in one or both of the ear cups and may be used in detecting ear patterns on the ear-facing surface 36 of one or both ear cups.

When worn in an unreversed configuration, the right ear cup of device 10 will supply audio to the right ear of the user and the left ear cup of device 10 will supply audio to the left ear of the user. In a reversed configuration, the right ear cup is adjacent to the user's left ear and the left ear cup is adjacent to the user's right ear. For correct audio playback, the assignment of the left and right channels of audio that are being played back to the user can be reversed by control circuitry 20 (so that the left channel of audio is played through the right ear cup and vice versa) whenever device 10 is being worn in the reversed configuration. Unreversed right-left channel assignments may be used when device 10 is being worn in the unreversed configuration.

Device 10 may have an asymmetrical design or may have a symmetrical design. A symmetrical design may be used to provide device 10 with enhanced aesthetics. In some configurations for device 10 (e.g., when device 10 has a symmetrical design), there may be few or no recognizable differences between unreversed and reversed orientations for device 10. In this type of scenario, it may be desirable to use capacitive proximity sensor input or input from other sensors 26 to determine whether to operate device 10 in an unreversed audio playback or reversed audio playback configuration.

Figure 3:
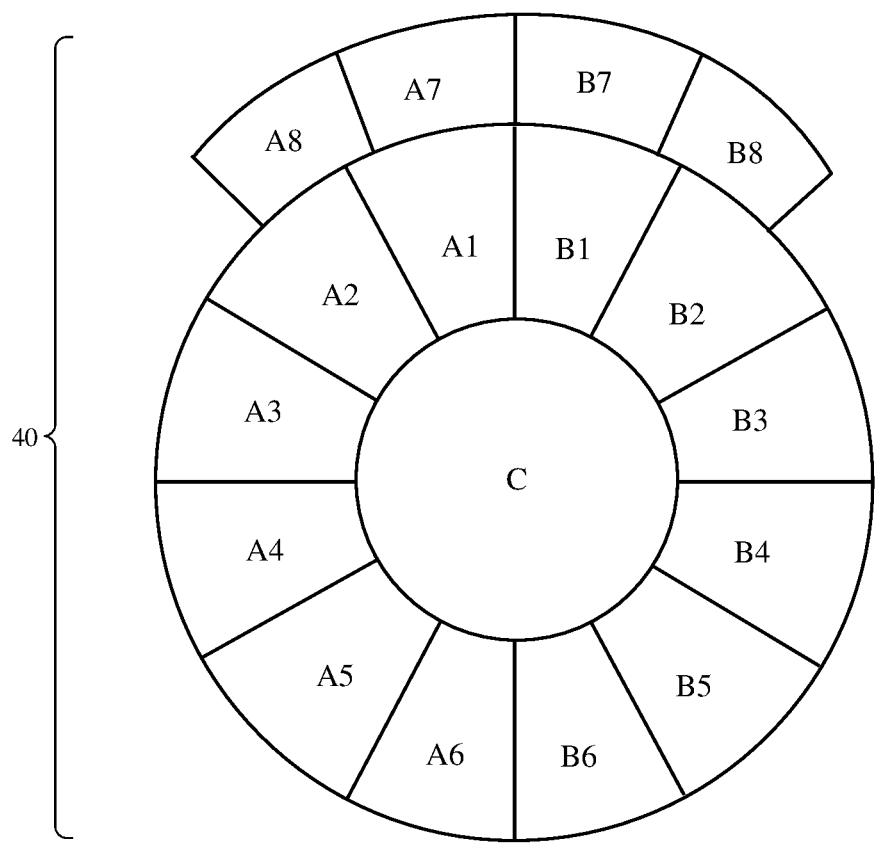
FIG. 3 is a diagram of an illustrative electrode layout for an electronic device such as a pair of headphones in accordance with an embodiment.

Capacitive proximity sensors on inwardly facing (ear-facing) surfaces 36 of ear cups 30 may be used to measure the shapes of the user's ears and thereby determine the orientation of device 10 on the user's head. An illustrative pattern of electrodes 40 that may be used on each ear cup inner surface 36 is shown in FIG. 3. In the example of FIG. 3, each electrode (A1 . . . A8, B1 . . . B8, and C) corresponds to a sense electrode 44 and corresponding reference electrode 42 and can be used independently or in a configuration in which two or more electrodes are joined together to enhance detection sensitivity. Electrodes 40 can be arranged in a circular-type pattern (e.g., a circular array in which some or all of the electrodes are arranged in a ring around a center point) and/or other shapes that are suitable for gathering information from the ears of a user.

Figure 4:
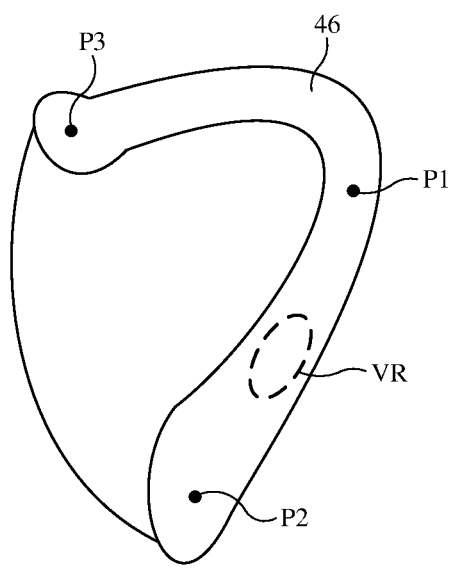
FIG. 4 is a diagram of an illustrative ear of a user in accordance with an embodiment.

A diagram of an illustrative ear of a user is shown in FIG. 4. As shown in FIG. 4, ear 46 may have points such as points P1, P2, and P3 that may be sensed by a capacitive proximity sensor. These points are distributed asymmetrically so that the pattern of points P1, P2, and P3 that is measured will indicate whether ear 46 is a right ear or a left ear. Some portions of ear 46 such as portion VR may be recessed with respect to prominent points such as points P1, P2, and P3. Portions such as portion VR may be measured by dynamically reconfiguring the electrodes of the capacitive proximity sensor to enhance the detection range of the sensor in portion VR relative to portions of ear 46 in the vicinity of points P1, P2, and P3.

Figure 5:
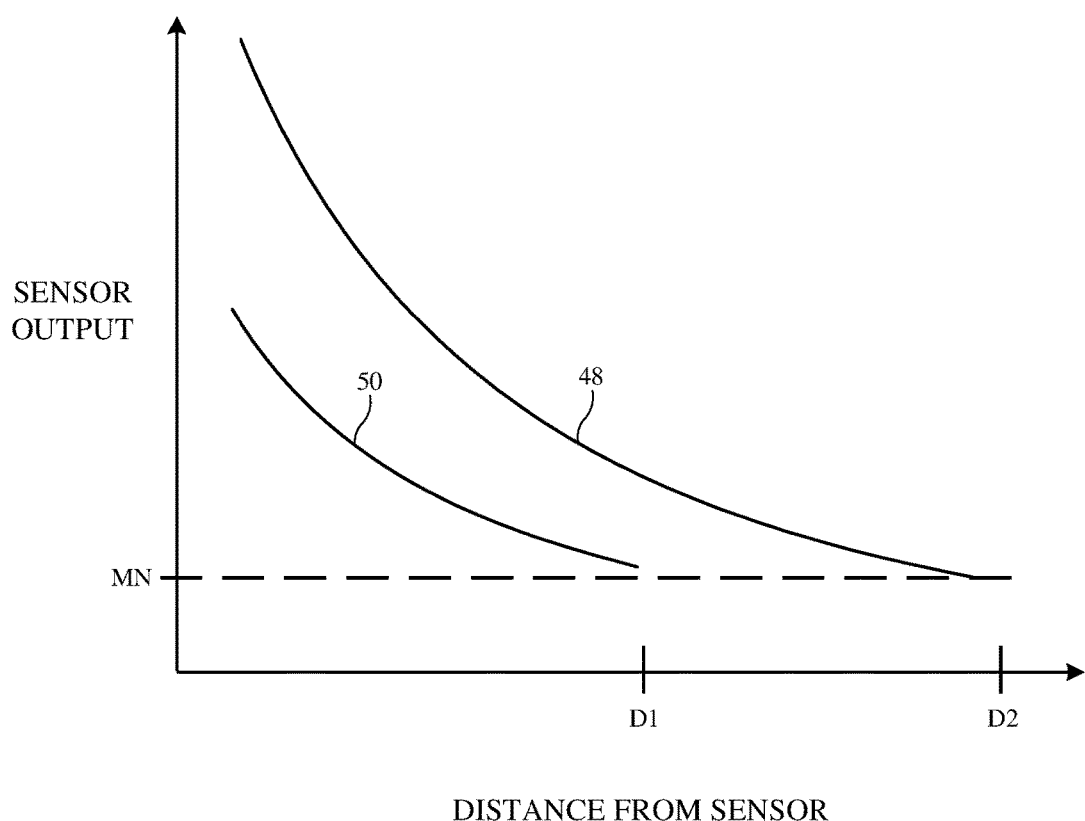
FIG. 5 is a graph showing how capacitive proximity sensor output may vary as a function of distance from an object being measured and as a function of electrode size in accordance with an embodiment.

FIG. 5 is a graph showing how sensor electrodes of different sizes exhibit different measurement sensitivities. In the graph of FIG. 5, sensor output has been plotted as a function of distance to an external object that is being sensed. Curve 50 is representative of a sensor electrode of a first size. The maximum detection range of an electrode of this first size is D1, due to the presence of system noise MN. Curve 48 is representative of a sensor electrode of a second size that is larger than the first given size. As indicated by curve 48, a sensor with an enlarged capacitive electrode size can detect objects at a larger maximum distance (e.g., distance D2, which is larger than D1) before being limited by noise MN. Larger sensor electrode sizes exhibit reduced amounts of spatial resolution. To make satisfactory measurements on the ear's of a user or other external object, device 10 may dynamically configure electrodes 40 into multiple different operating modes. The operating modes may include one or more modes that favor enhanced spatial resolution over detection range and one or more modes that favor enhanced detection range over spatial resolution. By measurements made using these different modes, pattern recognition operations on external objects such as ear recognition operations may be enhanced.

Figure 6:
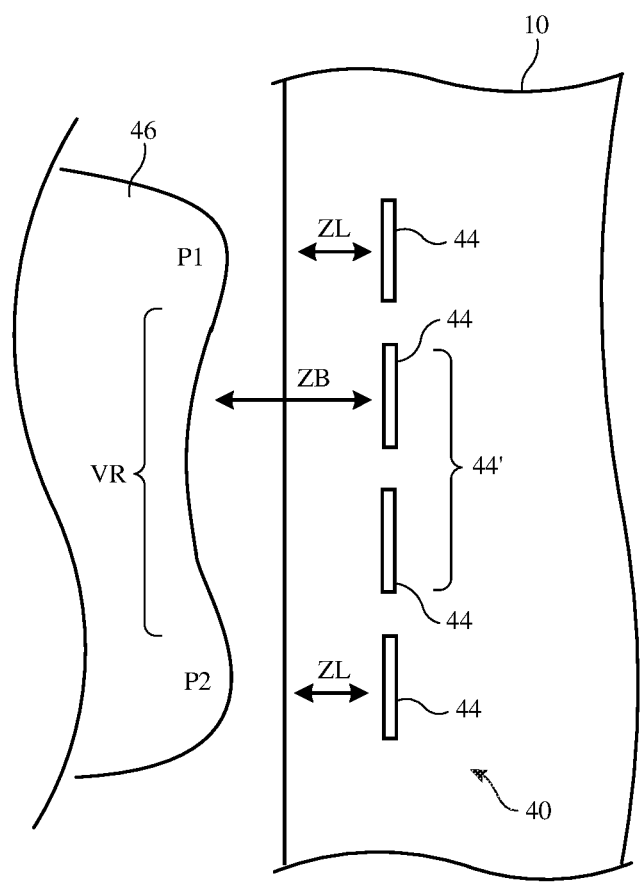
FIG. 6 is a cross-sectional side view of a portion of an ear cup in a pair of headphones showing how electrodes in the headphones may be separated from different portions of a user's ear by different ear-to-electrode spacing distances in accordance with an embodiment.

Consider, as an example, the scenario of FIG. 6, in which a capacitive proximity sensor in device 10 is using electrodes 40 to make proximity sensor measurements on ear 46. As shown in the cross-sectional side view of FIG. 6, ear 46 may have portions such as portions P1 and P2 that are at a first distance ZL from electrodes 40 (e.g., from sense electrodes 44) and may have other portions such as portion VR that are located at a second distance ZB from electrodes 40 (e.g., from electrodes 44). Distance ZB is larger than distance ZL. To enhance the sensitivity of the capacitive proximity sensor of device 10 to enable satisfactory measurements at larger distances such as distance ZL, multiple electrodes 44 can be dynamically configured to operate together and thereby serve as a unitary electrode 44' of enlarged area. As described in connection with FIG. 5, the use of larger electrodes each of which is formed from set of smaller combined electrodes (e.g., using electrode 44' in place of a pair of smaller electrodes 44) enhances the ability of device 10 to detect ear 46 in region VR by extending the sensitivity of the capacitive proximity sensor adjacent to region VR relative to the sensitivity of the capacitive proximity sensor in regions in which only smaller electrodes 44 are independently used.

Figure 7:
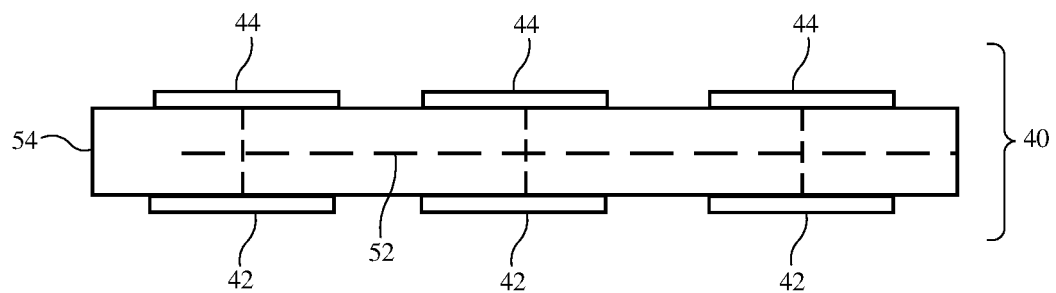
FIG. 7 is a cross-sectional side view of a portion of an illustrative capacitive proximity sensor showing how electrodes for the sensor may be supported by a substrate in accordance with an embodiment.

FIG. 7 is a cross-sectional side view of illustrative capacitive proximity sensor electrodes 40. As shown in the illustrative configuration of FIG. 7, electrodes 40 may include sense electrodes 44 supported on a first surface of substrate 54 and corresponding reference electrodes 42 on an opposing second surface of substrate 54. Interconnections 52 may be used in routing signals between electrodes 40 and control circuitry 20. Interconnects 52 may be formed on one or both surfaces of substrate 54 and/or may be embedded within substrate 54. Control circuitry 20 may include one or more integrated circuits mounted to substrate 54 or mounted to one or more separate substrates electrically coupled to substrate 54. Control circuitry 20 may be located in one of ear cups 30, in both ear cups 30 and/or elsewhere in device 10. Electrodes 40 may be formed from metal (e.g., metal traces deposited using techniques such as physical vapor deposition, chemical vapor deposition, electrochemical deposition techniques such as electroplating and electroless deposition, printing of metal paint, etc.). Interconnects 52 may be metal signal traces in a printed circuit or other conductive paths. Substrate 54 may be a printed circuit such as a flexible printed circuit formed from a sheet of polyimide or other flexible dielectric or a rigid printed circuit board formed from rigid printed circuit board material such as fiberglass-filled epoxy or may be a substrate formed from other suitable dielectric substrate materials.

Figure 8:
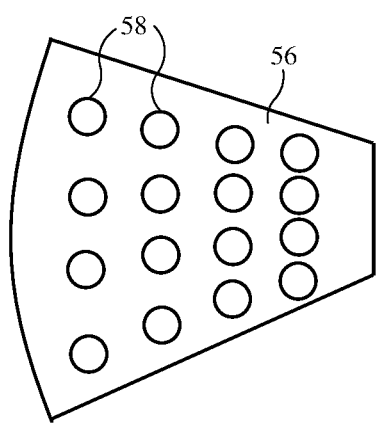
FIG. 8 is a top view of an illustrative capacitive sensor electrode with acoustic openings in accordance with an embodiment.

To accommodate acoustic signals, electrodes 40 may be provided with openings such as openings 58 in illustrative sensor electrode 56 of FIG. 8. Openings 58 may be circular, may be rectangular, may be arranged in an array, and/or may have other suitable shapes and patterns. Electrodes such as electrode 56 of FIG. 8 may be used in forming electrodes 44 and/or electrodes 42. For example, a first electrode with sound passageway openings may be formed on a first side of a printed circuit substrate and a second electrode with sound passageway openings may be formed on a second side of a printed circuit substrate to form an array of electrodes 40 (e.g., electrodes having a ring-shaped layout of the type shown in FIG. 3 or other suitable pattern of sensor electrodes). The sound passageways of electrodes 40 may be aligned with openings in substrate 54 and openings in other stacked layers of material in device 10, thereby allowing sound from a speaker in each ear cup to pass to the ear of a user.

Figure 9:
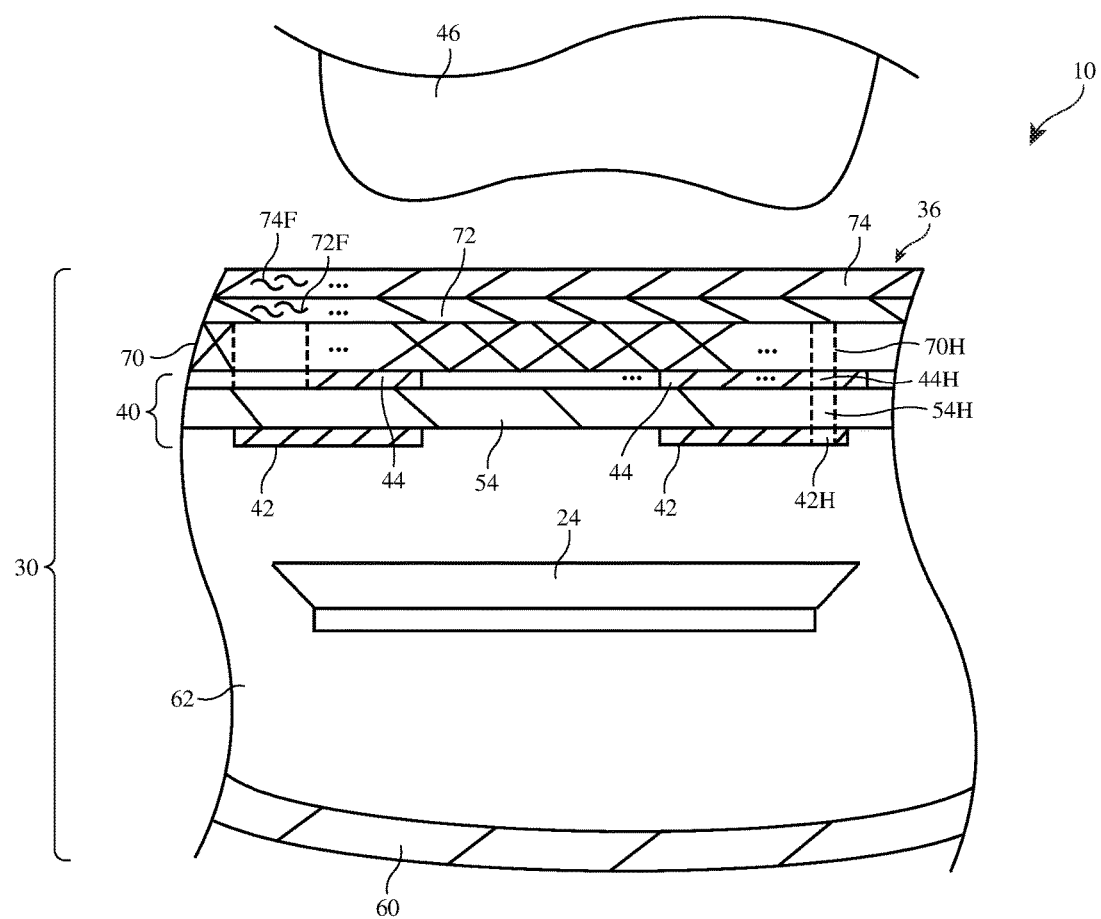
FIG. 9 is a cross-sectional side view of an illustrative ear cup in a pair of headphones in accordance with an embodiment.

A cross-sectional side view of device 10 showing how the structures of device 10 (e.g., each of ear cups 30) may be provided with acoustic passageways such as circular through-holes or other openings is shown in FIG. 9. As shown in FIG. 9, ear cup 30 may have an interior portion (e.g., a cavity) such as interior 62. Speaker 24 may be mounted in interior 62 and may provide sound to ear 46 through acoustic passageways formed from the layers of material interposed between ear-facing surface 36 and speaker 24. Rear housing wall 60 may be formed from one or more structures such as a plastic housing member, fabric layers, layers of plastic, leather, or other materials, and/or other housing structures.

Layer 74 may be formed from fabric. Layer 74 may, for example, be formed from a fabric in which strands of material 74F such as plastic or natural yarns have been intertwined using weaving, knitting, braiding, or other fiber intertwining techniques. The intertwining process used to form layer 74 may configure layer 74 so that sound may pass through layer 74 without significant attenuation. If desired, other layers of material may be used in forming the outermost layer of material under surface 36 (e.g., wire or plastic meshes, open cell plastic foam, natural materials with openings such as perforated leather, perforated plastic, etc.). The use of a layer of fabric to form layer 74 is illustrative.

If desired, ear cup 30 may have multiple layers of fabric. For example, additional fabric layer 72 with strands of material such as strands 72F may be formed under layer 74. As with layer 74, the density of fibers in layer 72 is preferably sufficiently low to create acoustic passageways (air-filled passageways) through layer 72 so that sound from speaker 24 can pass to ear 46 without being overly attenuated. With one illustrative configuration, outer layer 74 is formed from a finely woven fabric and inner layer 72 is formed from a more coarsely woven fabric. Other fabric arrangements (e.g., arrangements with only a single layer of fabric such as a layer of fabric into which fine and/or coarse portions have been woven, arrangements with three or more layers of fabric, etc.) may also be used.

Under layer 72, ear cup 30 may include a protective structural layer such as mesh layer 70. Mesh layer 70 may be formed from a layer of plastic, metal, or other material with openings such as openings 70H. Openings 70H may be formed in an array with a sufficient density to allow sound from speaker 24 to pass through layer 70 without significant attenuation. The presence of layer 70 may help strengthen ear cup 30 (e.g., to prevent inadvertent damage from puncturing of the ear cup with a foreign object, etc.). If desired, layers of open-cell foam and/or other material may be incorporated into ear cup 30 under layer 74. The example of FIG. 9 is illustrative.

In the arrangement of FIG. 9, mesh layer 70 overlaps sensors electrodes 40. Electrodes 40 may be formed in an array in which sense electrodes 44 are formed on a first side (e.g., an ear-facing side) of substrate 54 and in which corresponding reference electrodes 42 are formed on an opposing side (e.g., a speaker-facing side) of substrate 54. As described in connection with FIG. 8, electrodes 44 may have acoustic openings 44H and electrodes 42 may have acoustic openings 42H (e.g., first and second respective sets of aligned openings). These overlapping openings may be aligned with corresponding overlapping openings 54H in substrate 54 to allow sound from speaker 24 to pass to ear 46.

Configurations of the type shown in FIG. 9 allow sound from speaker 24 to reach the ears of a user while allowing control circuitry 20 to use the capacitive proximity sensor formed from electrodes 40 in making measurements on the shape of the user's ears (e.g., in detecting left and right user ear patterns). This allows control circuitry 20 to detect the orientation of device 10 on the head (ears) of a user. Based on the detected orientation, control circuitry 20 can configure its audio circuitry (e.g., left and right audio amplifiers coupled to speakers 24) so that left channel audio and right channel audio are routed appropriately to a user's ears.

If desired, additional structures may be formed in ear cup 30 such as one or more additional layers of material overlapping speaker 24 and/or electrodes 40, additional cosmetic and/or protective layers, etc.

Figure 10:
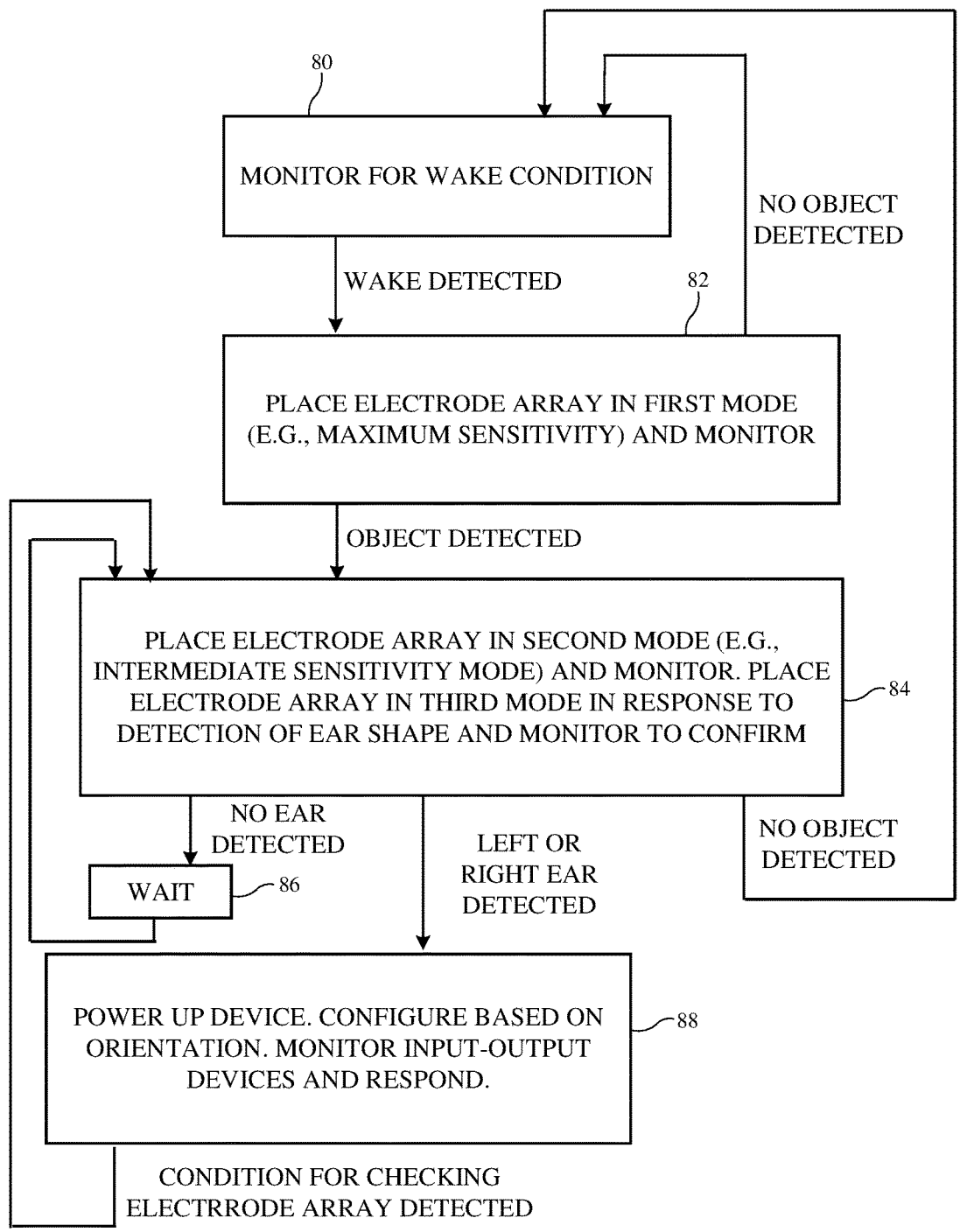
FIG. 10 is a flow chart of illustrative operations involved in using an electronic device with dynamically configurable capacitive proximity sensor electrodes in accordance with an embodiment.

FIG. 10 is a flow chart of illustrative operations involved in using device 10.

During the operations of block 80, control circuitry 20 may monitor sensors 26 to determine whether device 10 is being used by a user. Control circuitry 20 may, for example, gather motion data using an accelerometer and may compare this motion data to a predetermined motion threshold. If the motion information from sensors 26 indicates that device 10 is in motion (e.g., if motion readings exceed a predetermined threshold), control circuitry 20 may conclude that a user is using device 10. In response to detecting that device 10 is in motion and in use, control circuitry 20 may awaken device 10 from a low-power sleep state and may proceed to make proximity sensor measurements to determine the orientation of device 10 on the head of a user.

During the operations of block 82, control circuitry 20 may, for example, place the array of electrodes 40 in device 10 in a first operating mode appropriate for detecting whether ears 46 are present adjacent to surfaces 36. Electrodes 40 may have a circular layout of the type shown in FIG. 3 or other suitable layout. Control circuitry 20 (e.g., controller 20B) may control capacitive sensing circuit 20A-2 and switch 20A-1 so that one or more sets of multiple electrodes 40 are combined to enhance external object detection range while device 10 is operated in the first mode. Control circuitry 20 may, as an example, use switch 20A-1 to short multiple electrodes together such as electrodes A1-A6 and B1-B6 and/or all of the electrodes 40 in the array of electrodes 40 in each ear cup 30 so that these electrodes serve as a larger unitary electrode in each ear cup 30 (e.g., a maximum area electrode that may be used in detecting external objects with a corresponding maximized detection range). Configurations in which fewer than all electrodes 40 are coupled together using switch 20A-1 may also be used.

While operating in the first capacitive proximity sensor configuration (e.g., the first operating mode of block 82), control circuitry 20 (e.g., capacitive sensing circuit 20A-2) may monitor electrodes 40 for the presence of an external object such as an ear of the user. In response to detecting no object for a predetermined time period (e.g., in response to failing to detect any output of the capacitive sensing circuit that passes a predetermined threshold amount within a predetermined amount of time such as 10 s, at least 2 s, less than 30 s, or other suitable timeout time period), control circuitry 20 (e.g., controller 20B) may place device 10 (e.g., control circuitry 20) in a low-power sleep state and operations may return to block 80. In response to detecting that an external object is in the vicinity of surface 36 (e.g., within 1-3 cm, within less than 3 cm, within at least 1 mm, or other suitable range of surface 36), control circuitry 20 may place device 10 in a second operating mode (see, e.g., the operations of block 84).

While operating in the second mode (block 84), control circuitry 40 may configure the array of electrodes 40 in device 10 so that fewer electrodes are combined together than in the first operating mode. With one illustrative configuration, some of electrodes 40 are coupled together in pairs or in sets of three or more electrodes to enhance detection range, whereas other electrodes 40 are used individually. With another illustrative configuration, all of electrodes 40 are coupled together in pairs or in sets of three or in sets of four or more electrodes. Regardless of the particular electrode configuration created by control circuitry 20 using switch 20A-1, at least some of the unitary electrode(s) of the first mode are divided into more granular electrodes, so spatial resolution is enhanced in the second mode relative to the first mode, while detection range is decreased. This allows device 10 to more clearly identify ear shapes in the second mode than in the first mode. An ear shape measurement in the second operation mode may, for example, be sufficient in spatial resolution to discriminate between a pattern associated with a left ear and a pattern associated with a right ear. If desired, control circuitry 20 can place electrodes 40 in one or more additional configurations to further enhance spatial resolution and thereby make more detailed proximity measurements to further confirm whether a measured ear pattern corresponds to a right or left ear. Control circuitry 20 may, as an example, place device 10 in a third operating mode in which switch 20A-1 couples each of electrodes 44 to capacitive sensing circuit 20A-2 individually so that capacitive proximity sensor measurements of maximum spatial resolution may be obtained (at minimum detection range). The measurements made in the optional third mode N may be used in confirming detection of a left or right ear (e.g., these measurements may be used to enhance the accuracy of the left/right ear determination measurements made while operating the capacitive proximity sensor in the second operating mode). In modes such as the first, second, and third operating modes, control circuitry 20 can use switch 20A-1 to sequentially step through each set of electrodes of interest, so that measurements can be systematically gathered form all electrodes 40 of interest. Configurations in which parallel sensor electrode measurements are gathered by control circuitry 20 may also be used, if desired.

If no external objects are detected during the operations of block 84, control circuitry 20 may place device 10 in a low-power sleep state and may return to the operations of block 80. If an external object is detected by the capacitive proximity sensor but no left or right ear pattern is detected, control circuitry 20 can conclude that a user's hand or other external object other than a human ear is present in the vicinity of surface 36. Control circuitry 20 can therefore wait during the operations of block 36 (e.g., for a time period of at least 1 s, 1-20 s, less than 30 s, or other suitable time period) before looping back to block 84 to gather additional sensor measurements. If desired, control circuitry 20 may impose the wait of block 86 in response to other types of measurements such as when measurements indicate a fault condition (e.g., if two right ears are detected, if two left ears are detected, or if only a single ear is detected even though objects are present at both ear cup surfaces 36).

In response to detection in each ear cup 30 of a left or right ear (or at least one ear in one ear cup), device 10 may take appropriate actions at block 88. During the operations of block 88, control circuitry 20 may, for example, fully power up the circuitry of device 10 (e.g., by turning on audio amplifier circuitry in control circuitry 20, by turning on wireless communications circuitry in device 10 and establishing wireless link 28 with device 10', etc.).

The audio amplifier circuitry in control circuitry 20 may be configured in response to the detected orientation of device 10 on the ears of a user. For example, left channel audio can be routed to the speaker in the ear cup at which the user's left ear has been detected and right channel audio can be routed to the speaker in the ear cup at which the user's right ear has been detected. Audio playback operations with this set of ear cup assignments may then be performed so that a user can automatically enjoy stereo audio without experiencing undesired reversed audio channel assignments. During normal operations at block 88, control circuitry 20 can monitor input-output devices 22 and take appropriate actions. For example, control circuitry 20 can monitor an accelerometer, compass, gyroscope, or other orientation sensor circuitry to measure the orientation of device 10 as the position of the user's head shifts, can use buttons and other input devices to gather user input, and/or can gather other information about the operating environment of device 10 and user input commands being supplied to device 10. Based on this information, audio playback operations and/or other system functions can be adjusted (e.g., playback volume, left/right balance, bass/treble settings, surround sound mode, etc.).

Normal device operations at block 88 may also involve periodically determining whether control circuitry 20 should make additional proximity sensor measurements. For example, a timer may expire, a lack of movement may be detected, or other conditions may arise that indicate to control circuitry 20 that processing should loop back to block 84 to gather proximity sensor measurements (e.g., maintenance measurements) and thereby confirm previous ear pattern recognition results. During these maintenance measurements, control circuitry may operate the capacitive proximity sensor(s) in device 10 in sensor modes such as the second and/or third operating modes and/or in additional maintenance modes. Sensor sensitivity may be calibrated during maintenance operations and/or ear presence may be confirmed. If control circuitry 20 senses that the operating status of device 10 has changed (e.g., if the orientation of device 10 on the ears of the user has been reversed or if device 10 is no longer being worn by the user), control circuitry 20 can take appropriate action by updating the channel assignments at block 88 or returning to block 80, respectively.

Table of Reference Numerals

| | | | |
|---|---|---|---|
| 10 | electronic device | 10' | external equipment |
| 20 | control circuitry | 20A-1 | switching circuitry |
| 20A-2 | capacitive sensing circuitry | 20B | controller |
| 22 | input-output devices | 24 | speaker |
| 26 | sensor elements | 28 | wireless link |
| 30 | ear cups | 32 | area |
| 34 | band | 36 | user-facing ear cup surfaces |
| 40 | capacitive proximity sensor electrodes | 42 | reference electrodes |
| 42H | acoustic openings | 44 | sense electrodes |
| 44' | unitary electrode | 44H | acoustic openings |
| 46 | ear | 48 | curve |
| 50 | curve | 52 | interconnects |
| 54 | substrate | 54H | overlapping openings |
| 56 | illustrative sensor electrode | 58 | openings |
| 60 | rear housing wall | 62 | interior |
| 70 | mesh layer | 70H | openings |
| 72 | layer | 72F | strands |
| 74 | layer | 74F | material |
| 80 | block | 82 | block |
| 84 | block | 86 | block |
| 88 | block | A1 ... A8 | sense electrodes |
| B1 ... B8 | sense electrodes | C | sense electrodes |
| D1 | maximum detection range | D2 | distance |
| MN | system noise | P1 | point |
| P2 | point | P3 | point |
| VR | portion | ZB | distance |
| ZL | distance | | |

The foregoing is merely illustrative and various modifications can be made to the described embodiments. The foregoing embodiments may be implemented individually or in any combination.

What is claimed is:

1. A wearable electronic device, comprising:
a controller; and
a capacitive proximity sensor coupled to the controller, wherein the capacitive proximity sensor includes:
electrodes;
switching circuitry coupled to the electrodes; and
a capacitive sensing circuit coupled to the electrodes and the switching circuitry, wherein the controller is configured to adjust the switching circuitry to dynamically combine at least one set of the electrodes to form at least one corresponding unitary electrode of enhanced size.

2. The wearable electronic device defined in claim 1 further comprising a speaker, wherein at least some of the electrodes are arranged in an array overlapping the speaker.

3. The wearable electronic device defined in claim 2 wherein at least some of the electrodes have acoustic openings configured to pass sound from the speaker.

4. The wearable electronic device defined in claim 3 wherein the capacitive proximity sensor includes a substrate having openings aligned with the acoustic openings of the electrodes.

5. The wearable electronic device defined in claim 4 wherein the electrodes include reference electrodes on a first side of the substrate and sense electrodes on an opposing second side of the substrate.

6. The wearable electronic device defined in claim 5 wherein the second side of the substrate faces the speaker and wherein the wearable electronic device further comprises at least one layer of fabric configured to allow the sound from the speakers to pass.

7. The wearable electronic device defined in claim 6 further comprising a mesh layer interposed between the layer of fabric and the substrate.

8. The wearable electronic device defined in claim 5 wherein at least some of the sense electrodes are arranged in a ring.

9. The wearable electronic device defined in claim 1 wherein the controller is configured to recognize left ear sensor measurement patterns and right ear sensor measurement patterns in sensor measurements gathered with the capacitive proximity sensor.

10. The wearable electronic device defined in claim 1 further comprising an accelerometer, wherein the controller is configured to gather capacitive proximity sensor measurements with the capacitive proximity sensor at least partly in response to information from the accelerometer.

11. The wearable electronic device defined in claim 1 further comprising first and second ear cups having first and second respective speakers, wherein at least some of the electrodes are in the first ear cup.

12. The wearable electronic device defined in claim 1 further comprising at least one layer of fabric overlapping the electrodes.

13. The wearable electronic device defined in claim 12 wherein the electrodes are formed on a substrate having substrate openings and have electrode openings that overlap the substrate openings, the wearable electronic device further comprising a speaker configured to emit sound that passes through the substrate openings, electrode openings, and the layer of fabric.

14. Headphones, comprising:
first and second ear cups;
a structure that couples the first and second ear cups;
control circuitry; and
capacitive proximity sensor electrodes in the first and second ear cups, wherein the control circuitry is configured to dynamically combine at least a selected number of the capacitive proximity sensor electrodes to form at least one corresponding unitary electrode.

15. The headphones defined in claim 14 further comprising:
a first speaker in the first ear cup that is overlapped by a first set of the capacitive proximity sensor electrodes; and
a second speaker in the second ear cup that is overlapped by a second set of the capacitive proximity sensor electrodes, wherein at least some of the capacitive proximity sensor electrodes in the first and second sets of capacitive proximity sensor electrodes have acoustic openings.

16. The headphones defined in claim 15 further comprising an accelerometer, wherein the control circuitry is configured to use the capacitive proximity sensor electrodes to make ear pattern measurements in response to detection of motion with the accelerometer.

17. The headphones defined in claim 16 wherein the control circuitry is configured to adjust left and right audio channel assignments for the first and second speakers based on information from the capacitive proximity sensor electrodes.

18. Headphones, comprising:
first and second speakers;
control circuitry; and
capacitive proximity sensor electrodes overlapping at least one of the first and second speakers, wherein the control circuitry is configured to operate in:
a first mode in which at least some of the capacitive proximity sensor electrodes are combined by the control circuitry to enlarge sensor electrode area and enhance detection range; and
a second mode in which fewer of the capacitive proximity sensor electrodes are combined than in the first mode to enhance detection spatial resolution.

19. The headphones defined in claim 18 wherein the control circuitry is further configured to operate in a third mode in which fewer of the capacitive proximity sensor electrodes are combined than in the second mode.

20. The headphones defined in claim 19 further comprising an accelerometer, wherein the control circuitry is configured to make ear pattern measurements with the capacitive proximity sensor electrodes in the first mode in response to detection of motion with the accelerometer.

21. Apparatus, comprising:
a controller;
fabric; and
a capacitive proximity sensor coupled to the controller and overlapped by the fabric, wherein the capacitive proximity sensor includes:
electrodes;
switching circuitry coupled to the electrodes; and
a capacitive sensing circuit coupled to the electrodes and the switching circuitry, wherein the controller is configured to adjust the switching circuitry to dynamically combine at least one set of the electrodes to form at least one corresponding unitary electrode of enhanced size.

* * * * *